(12) United States Patent
Fuergut et al.

(10) Patent No.: US 10,685,909 B2
(45) Date of Patent: Jun. 16, 2020

(54) POWER PACKAGE HAVING MULTIPLE MOLD COMPOUNDS

(71) Applicant: Infineon Technologies AG, Neubiberg (DE)

(72) Inventors: Edward Fuergut, Dasing (DE); Martin Gruber, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/816,090

(22) Filed: Nov. 17, 2017

(65) Prior Publication Data
US 2019/0157190 A1    May 23, 2019

(51) Int. Cl.
*H01L 23/495* (2006.01)
*H01L 23/31* (2006.01)
*H01L 25/11* (2006.01)
*H01L 21/48* (2006.01)
*H01L 21/56* (2006.01)

(52) U.S. Cl.
CPC .... *H01L 23/49548* (2013.01); *H01L 21/4842* (2013.01); *H01L 21/561* (2013.01); *H01L 23/3107* (2013.01); *H01L 23/49555* (2013.01); *H01L 23/49562* (2013.01); *H01L 23/49575* (2013.01); *H01L 25/11* (2013.01); *H01L 2224/0603* (2013.01); *H01L 2224/48137* (2013.01); *H01L 2224/48247* (2013.01); *H01L 2224/48472* (2013.01); *H01L 2224/49111* (2013.01)

(58) Field of Classification Search
None
See application file for complete search history.

(56) References Cited

U.S. PATENT DOCUMENTS

| 8,772,923 | B2* | 7/2014 | Minamio | H01L 21/565 257/692 |
| 2005/0184372 | A1* | 8/2005 | Asahi | H05K 1/148 257/678 |
| 2007/0018197 | A1* | 1/2007 | Mochida | H01L 25/105 257/177 |
| 2009/0115038 | A1* | 5/2009 | Son | H01L 21/565 257/675 |
| 2009/0251119 | A1* | 10/2009 | Stojcic | H01L 24/49 323/282 |
| 2012/0214351 | A1* | 8/2012 | Shiratori | H01R 13/6471 439/692 |
| 2013/0026616 | A1* | 1/2013 | Lee | H01L 23/4334 257/675 |

(Continued)

*Primary Examiner* — Nishath Yasmeen
(74) *Attorney, Agent, or Firm* — Murphy, Bilak & Homiller, PLLC

(57) ABSTRACT

A semiconductor device package includes a lead frame, a first power semiconductor device mounted on a first part of the lead frame and a second power semiconductor device mounted on a second part of the lead frame. The first power semiconductor device is encapsulated by a first mold compound. The second power semiconductor device is encapsulated by a second mold compound. The first mold compound and the second mold compound are substantially separate from each other. The lead frame includes an intermediate part arranged between the first part and the second part. The intermediate part is not covered by the first mold compound or by the second mold compound.

14 Claims, 12 Drawing Sheets

(56) References Cited

U.S. PATENT DOCUMENTS

2015/0243588 A1* 8/2015 Edwards ........... H01L 23/49503
   257/670
2016/0172280 A1* 6/2016 Ranmuthu ........ H01L 23/49568
   257/379
2017/0110573 A1   4/2017 Laforet et al.

* cited by examiner

POWER PACKAGE HAVING MULTIPLE MOLD COMPOUNDS

TECHNICAL FIELD

This disclosure relates generally to the technique of semiconductor device packaging, and in particular to aspects of packaging power semiconductor devices which offer product-to-system improvements and high power dissipation capabilities.

BACKGROUND

Semiconductor device manufacturers are constantly striving to increase the performance of their products, while decreasing their costs of manufacture and system integration. The performance of a semiconductor device depends from the heat dissipation capability provided by the package. Further, packages which are easy to implement in a system with high thermal robustness at low expenses are desirable.

SUMMARY

An aspect of the disclosure relates to a semiconductor device package. The semiconductor device package includes a lead frame, a first power semiconductor device mounted on a first part of the lead frame and a second power semiconductor device mounted on a second part of the lead frame. The first power semiconductor device is encapsulated by a first mold compound. The second power semiconductor device is encapsulated by a second mold compound. The first mold compound and the second mold compound are substantially separate from each other. The lead frame includes an intermediate part arranged between the first part and the second part, the intermediate part is not covered by the first mold compound or by the second mold compound.

An aspect of the disclosure relates to a power semiconductor system. The power semiconductor system includes a semiconductor device package, which includes a lead frame, a first power semiconductor device mounted on a first part of the lead frame and a second power semiconductor device mounted on a second part of the lead frame. The first power semiconductor device is encapsulated by a first mold compound. The second power semiconductor device is encapsulated by a second mold compound. The first mold compound and the second mold compound are substantially separate from each other. The lead frame includes an intermediate part arranged between the first part and the second part, the intermediate part is not covered by the first mold compound or by the second mold compound. The power semiconductor system further includes at least one heat sink thermally and mechanically coupled to the first mold compound and the second mold compound An aspect of the disclosure relates to a method of manufacturing a semiconductor device package. The method includes mounting a first power semiconductor device on a first part of a lead frame and mounting a second power semiconductor device on a second part of the lead frame. The first power semiconductor device is encapsulated by a first mold compound. The second power semiconductor device is encapsulated by a second mold compound. The first mold compound and the second mold compound are substantially separate from each other. The lead frame comprises an intermediate part arranged between the first part and the second part, the intermediate part is not covered by the first mold compound or by the second mold compound.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts. It is to be understood that the features of the various examples of embodiments described below may be combined with each other, unless specifically noted otherwise.

DETAILED DESCRIPTION

Figure 1A:
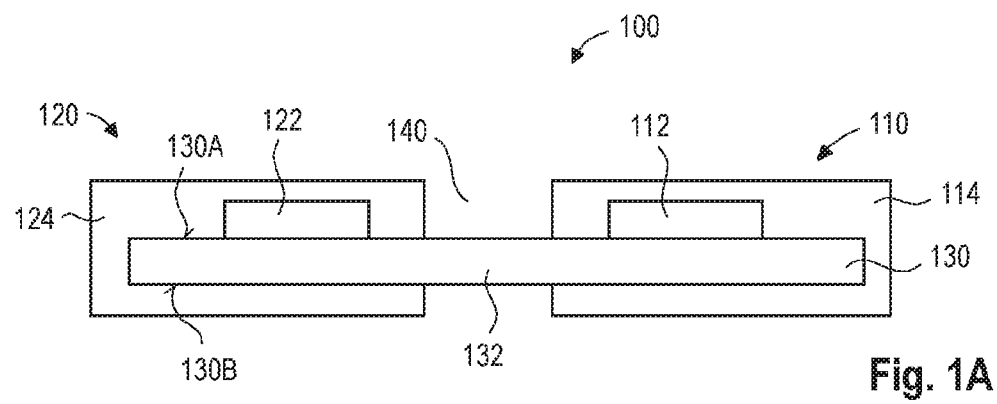
FIG. 1A is a cross-sectional view of an example of a semiconductor device package 100 in accordance with various embodiments.

In the following detailed description, reference is made to the accompanying drawings, which form a part thereof, and in which is shown by way of illustration specific embodiments in which the invention may be practiced. As employed in this specification, the terms "bonded", "attached", "connected", "mounted", "coupled" and/or "electrically connected/electrically coupled" are not meant to mean that the elements or layers must directly be contacted together; intervene", "attached", "connected", "mounted", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "mounted", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

A semiconductor device package as described herein includes at least two mold compounds. Each mold compound may form a package body of the semiconductor device package. Each mold compound may include a power semiconductor device. Each power semiconductor device may include one or more power semiconductor chips. A semiconductor power chip may monolithically integrate, e.g., one or more transistors, e.g. one or more transistors of any of the types recited below.

More specifically, power semiconductor chips may, for example, be configured as power MISFETs (Metal Insulator Semiconductor Field Effect Transistors), power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., PIN diodes or Schottky diodes.

Power semiconductor chip(s) may, e.g., have a vertical structure, that is to say that the semiconductor chip(s) may be fabricated in such a way that electric currents can flow in a direction perpendicular to the main surfaces of the semiconductor chip(s). A semiconductor chip having a vertical structure has electrodes on its two main surfaces, that is to say on its top side and bottom side. By way of example, in vertical devices, the source contact electrode and the gate contact electrode of a power MISFET or a power MOSFET or a power JFET or a HEMT may be situated on one main surface, while the drain contact electrode of the power MISFET or power MOSFET or power JFET or power HEMT may be arranged on the other main surface. Analogously, in bipolar transistor vertical devices, the emitter contact electrode and the gate contact electrode of a power IGBT may be situated on one main surface, while the collector contact electrode of the power IGBT may be arranged on the other main surface. In case of a power diode, the anode contact electrode may be situated on one main surface, while the cathode contact electrode of the power diode may be arranged on the other main surface. Further, it is also possible that the drain (collector) contact electrode and the gate contact electrode are situated on one main surface while the source (emitter) contact electrode is situated on the other main surface.

Further, semiconductor device packages containing semiconductor chip(s) having a horizontal structure may be involved. A semiconductor chip having a horizontal structure has chip electrodes only on one of its two main surfaces, e.g. on its active surface. Logic integrated circuit chips as well as power semiconductor chips (e.g. power MISFETs or power MOSFETs or power JFETs power HEMTs) may have a horizontal structure.

The semiconductor chips may be manufactured from specific semiconductor material such as, for example, Si, SiC, SiGe, GaAs, GaN, AlGaN, InGaAs, InAlAs, etc., and, furthermore, may contain inorganic and/or organic materials that are not semiconductors. In particular, semiconductor chips made of multiple layers of the above materials, e.g. GaN-on-Si chips or GaN-on-SiC chips may be involved. The semiconductor chips may be of different types and may be manufactured by different technologies.

The semiconductor chips may have electrodes (chip pads) which allow electrical contact to be made with the integrated circuits included in the semiconductor chips. The electrodes may include one or more metal layers which are applied to the semiconductor material of the semiconductor chips. The metal layers may be manufactured with any desired geometric shape and any desired material composition. The metal layers may, for example, be in the form of a layer or land covering an area. By way of example, any desired metal capable of forming a solder bond or a diffusion solder bond, for example Cu, Ni, NiSn, Au, Ag, Pt, Pd, In, Sn, and an alloy of one or more of these metals may be used as the material. The metal layers need not be homogenous or manufactured from just one material, that is to say various compositions and concentrations of the materials contained in the metal layers are possible.

The semiconductor device package described herein includes an electrically conducting lead frame. The lead frame may be encapsulated in a first mold compound forming a first package body and in a second mold compound forming a second package body. The lead frame may include a unitary (i.e. not formed of multiple pieces which are bonded together) intermediate part which is not covered by the first mold compound or by the second mold compound.

The lead frame may form a part of a structured metal sheet. The structured metal sheet may be made of any metal or metal alloy, e.g. copper or copper alloy.

Each package body may comprise a power semiconductor device encapsulated in a mold compound. The mold compounds may each form part of the periphery of the corresponding package bodies, i.e. may at least partly define the shape of the semiconductor package body.

The mold compounds are made of at least one encapsulating material. The encapsulating material may be an electrically insulating material. The encapsulating material may comprise or be a thermoset material or a thermoplastic material. A thermoset material may, e.g., be made on the basis of an epoxy resin, a silicone resin or an acrylic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The encapsulating material may include or be a polymer material, e.g. a duroplastic polymer material. The encapsulating material may include or be at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

The encapsulating material is a mold material. The encapsulating material may be applied over the power semiconductor device (e.g. semiconductor chip) and the lead frame by molding. Various techniques such as, e.g., compression molding, injection molding, powder molding, liquid molding, transfer molding or film-assisted molding (FAM) may be used to form the mold compounds.

A variety of different types of electronic power devices and/or power systems may be configured to use a semiconductor device package as described herein. By way of example, an electronic power device and/or power systems in accordance with the disclosure may constitute, e.g., an engine control unit (ECU), a power supply, a DC-DC voltage converter, an AC-DC voltage converter, a power amplifier, and many other devices.

In general, any power device and/or power system comprising at least two package bodies including at least one semiconductor power device or chip having a high thermal power loss and/or a comparatively small footprint area to dissipate the thermal power may benefit from the disclosure herein. By way of example, semiconductor power chips having, in operation, a thermal power loss of equal to or greater than, e.g., 1 W, 10 W, 20 W, 50 W, 100 W, 200 W, 300 W, 400 W, 500 W, or 1000 W and, e.g., and a footprint area for thermal power dissipation equal to or less than, e.g., 200 $mm^2$, 150 $mm^2$, 100 $mm^2$, 50 $mm^2$, 25 $mm^2$, 10 $mm^2$, 5 $mm^2$, 3 $mm^2$, or 1 $mm^2$ may use a multi-body power package as described herein for improving handling during product to system assembly as well as thermal behavior and power dissipation during operation.

Figure 1B:
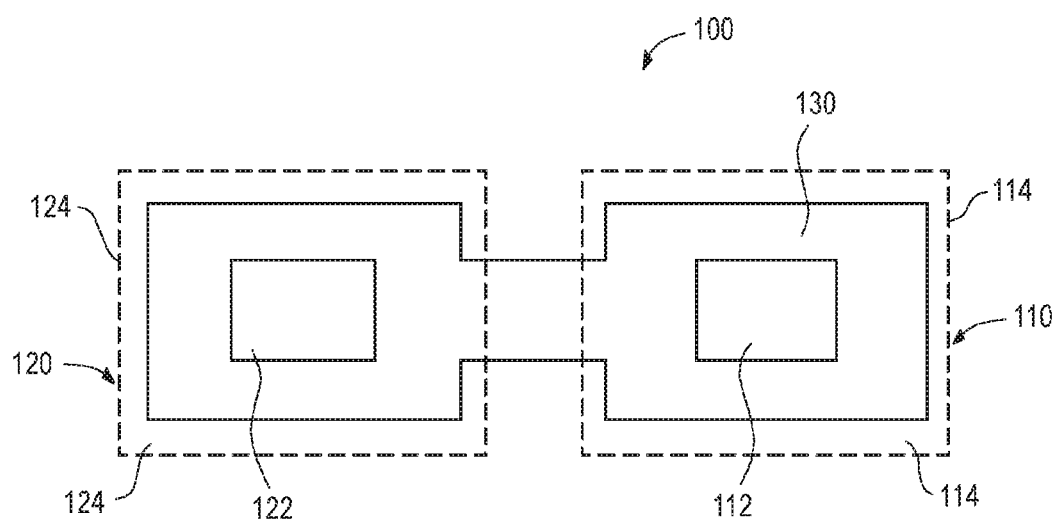
FIG. 1B is a top view of the semiconductor device package 100 before encapsulation in accordance with various embodiments.

FIG. 1A shows a cross-sectional view of an example of a semiconductor device package 100 and FIG. 1B shows a top view of the semiconductor device package 100 before encapsulation. The semiconductor device package 100 comprises a first mold compound 114 and a second mold compound 124 (shown by dashed lines in FIG. 1B). A first power semiconductor device 112 is encapsulated by the first mold compound 114, which may form a first package body 110. A second power semiconductor device 122 is encapsulated by the second mold compound 124, which may form a second package body 120. The first mold compound 114 and the second mold compound 124 are substantially separate from other. Throughout this disclosure, the term "substantially separate" may, e.g., mean that there may either be no connection of encapsulating material between the first mold compound 114 and the second mold compound 124 or that there may only be an insignificant connection of encapsulating material between the first mold compound 114 and the second mold compound 124 which is not rigid and/or inflexible and/or bulky enough to transfer mechanical properties such as, e.g., mechanical stress from one mold compound 114, 124 to the other mold compound 124, 114. Stated differently, the first and second mold compounds 114, 124 are mechanically decoupled from each other in terms of any stress transfer coupling via encapsulating material.

The first power semiconductor device 112 is mounted on a first part of a lead frame 130 and the second power semiconductor device 122 is mounted on a second part of a lead frame 130. The lead frame 130 mechanically and electrically connects the first mold compound 114 and the second mold compound 124. More specifically, the first part of the lead frame 130 may be cast in the first mold compound 114 and the second part of the lead frame 130 may be cast in the second mold compound 124.

The lead frame 130 may have a first main surface 130A and a second main surface 130B opposite the first main surface 130A. The first power semiconductor device 112 and the second power semiconductor device 122 may be mounted on the same main surface of the lead frame 130, e.g. on the first main surface 130A.

The lead frame 130 is encapsulated by the first mold compound 114 and is encapsulated by the second mold compound 124. An intermediate part 132 of the lead frame 130 arranged between the first part and the second part may be exposed from the first mold compound 114 and from the second mold compound 124. More specifically, the first surface 130A of the intermediate part 132 of the lead frame 130 and/or the second surface 130B of the intermediate part 132 of the lead frame 130 may be uncovered by (i.e. exposed from) both the first and second mold compounds 114, 124.

It is to be noted that the intermediate part 132 is an integral part of the lead frame 130, which is a unitary member. That is, the intermediate part 132 is not provided with a bonding joint (e.g. welding joint, soldering joint, adhesive joint, etc.) by which the lead frame 130 would be made of more than one part. Rather, although the first mold compound 114 defining the first package body 110 and the second mold compound 124 defining the second package body 120 are separate from each other, the unitary lead frame 130 may be an one-piece part which inherently is part of both package bodies 110, 120.

Further, the intermediate part 132 of the lead frame 130 may have an inherent structural stability sufficient to hold the first package body 110 and the second package body 120 in place even if not supported by other holding means. That is, rather than being a flexible package carrier (such as, e.g., a flexible PCB), the lead frame 130 and, in particular, the intermediate part 132 thereof may provide for stiffness and/or rigidity sufficient to control the positional relationship between the first mold compound 114 and the second mold compound 124 in a condition without any further holding or supporting means. In this respect, the semiconductor device package 100 may be regarded as a single semiconductor package having a spacing 140 (such as, e.g., a continuous spacing) between the first mold compound 114 and the second capsulation 124 which exposes at least one main surface 130A, 130B of the lead frame 130 and which separates the first mold compound 114 from the second mold compound 124 (or, stated differently, the first package body 110 from the second package body 120). The intermediate part 132 of the lead frame may form a power lead which connects the multiple (here: e.g. two) mold compounds 114, 124 (or package bodies 110, 120).

The intermediate part 132 of the lead frame 130 may be plastically deformable by bending so as to allow the first mold compound 114 and the second mold compound 124 to be brought in a determined spatial relationship towards each other (not shown in FIG. 1).

In various embodiments, the lead frame 130 may also be a hybrid carrier composed of, e.g., a lead frame and any other substrate, as is described further below in greater detail.

In some embodiments, the lead frame 130 may have a constant thickness along its extension, e.g. in particular the thickness of the intermediate part 132 may be the same as the thickness in the parts of the lead frame 130 which are encapsulated by the first mold compound 114 and/or the second mold compound 124. In other embodiments, the lead frame 130 may have different thicknesses along its extension, as is described in more detail further below.

The subdivision of a large package body into a multi-body package design as disclosed herein may be beneficial in several respects: First, the greater the area size (or diagonal length) of a mold compound (package body) the more mechanical stress is generated in the package caused by the CTE (coefficient of thermal extension) mismatch of the various materials (e.g. carrier, encapsulation material, chip material) of the package. Therefore, subdividing a large mold compound (package body) into a plurality of smaller mold compounds (package bodies) may be beneficial in avoiding detrimental effects (e.g. package warpage, degradation of thermal contact to a heat sink, reliability in case of large temperature cycles) based on CTE mismatch. Further, the separation of the first and second mold compounds from each other allows for a separation in view of the thermal load experienced by the mold compounds. By way of example, temperature sensitive components (such as, e.g., logic integrated circuits (ICs) or sensors and/or actuators) could be placed in a mold compound with lower thermal load or peak temperature than another mold compound accommodating more temperature resistant components such as, e.g., power switches.

Figure 2:
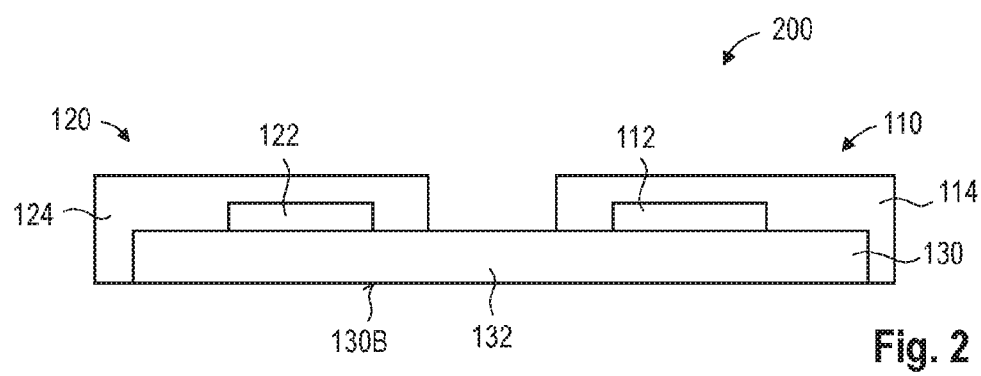
FIG. 2 is a cross-sectional view of an example of a semiconductor device package 200 in accordance with various embodiments.

FIG. 2 shows a cross-sectional view of an example of a semiconductor device package 200. Semiconductor device package 200 is similar to semiconductor device package 100 except that the second surface 130B of the lead frame 130 may remain exposed entirely or at least partially within the outline of the mold compounds 114, 124 by the first mold compound 114 of the first package body 110 and by the second mold compound 124 of the second package body 120. Other features are disclosed in conjunction with the semiconductor device package 100, and reference is made to the description thereof to avoid reiteration.

Figure 3A:
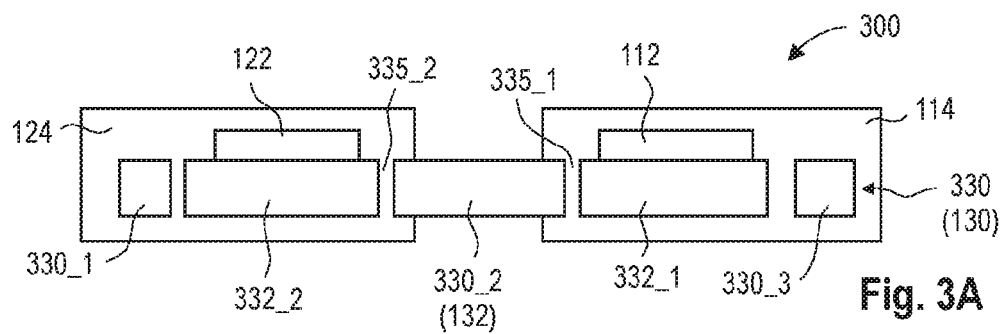
FIG. 3A is a cross-sectional view of an example of a semiconductor device package 300 in accordance with various embodiments.
Figure 3B:
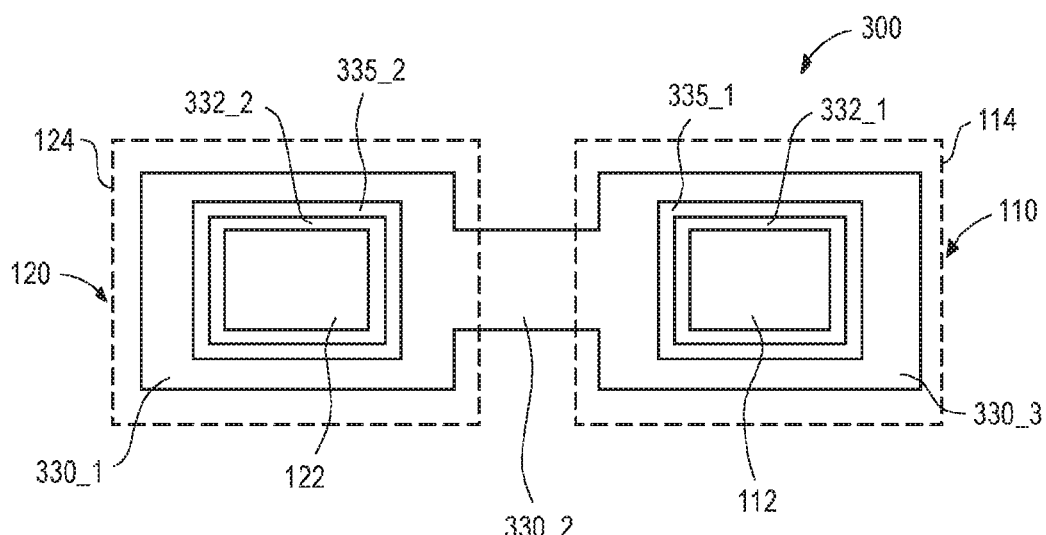
FIG. 3B is a top view of the semiconductor device package 300 before encapsulation in accordance with various embodiments.

FIG. 3A shows a cross-sectional view of an example of a semiconductor device package 300 and FIG. 3B shows a top view of the semiconductor device package 300 before encapsulation. Semiconductor device package 300 may be similar or identical to semiconductor device package 100 except that the lead frame 130 is a hybrid carrier, also denoted in the following as a hybrid lead frame 330. The hybrid lead frame 330 may include a common frame structure 330_1, 330_2, 330_3 and two power semiconductor device pads 332_1, 332_2. The common frame structure 330_1, 330_2, 330_3 is a lead frame. The intermediate part 132 of the lead frame 130 (here hybrid lead frame 330) is formed by the common frame structure 330_. In general, at least one opening 330_1 may be provided in the common frame structure 330_1, 330_2, 330_3 and at least one power semiconductor device pad 332_1 is inserted into this opening. Stated differently, while one of the package bodies 110, 120 may have a design as shown in FIGS. 1A, 1B, the other package body 120, 110 may be designed according to FIGS. 3A, 3B.

The first power semiconductor device pad 332_1 and the second power semiconductor device pad 332_2 may each be selected from the group consisting of, e.g., an insulated metal substrate (IMS), a metal substrate such as, e.g., a metal plate, e.g. copper plate, a metal composite plate, e.g. copper composite plate, a ceramic-based substrate, in particular a direct bonded copper (DBC) substrate, a ceramic thick film coated substrate, an active metal brazed (AMB) substrate or a printed circuit board (PCB). The first and second power semiconductor device pads 332_1, 332_2 may be formed as inlays to fit into first and second cutouts or openings 335_1, 335_2 in the common frame structure 330_1, 330_2, 330_3.

The first and second power semiconductor device pads 332_1, 332_2 may have high thermal and/or electrical conducting properties (i.e. lower thermal resistance and/or lower electrical resistance) than the common frame structure 330_1, 330_2, 330_3 (e.g. lead frame) in order to provide for advanced heat dissipation and/or electrical conductivity.

As shown in FIGS. 3A and 3B, the first and second power semiconductor device pads 332_1, 332_2 may be completely encapsulated by the first mold compound 114 and the second mold compound 124, respectively. That is, the entire periphery including the side faces of the first and second power semiconductor device pads 332_1, 332_2 may be covered by encapsulation material except the zones on which the first and second power semiconductor devices 112, 122 are bonded. The first mold compound 114 and a second mold compound 124 are shown in FIG. 3B by dashed lines.

Figure 4:
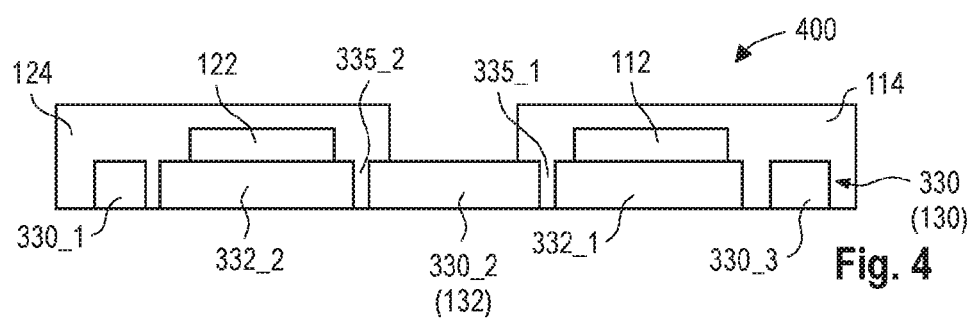
FIG. 4 is a cross-sectional view of an example of a semiconductor device package 400 in accordance with various embodiments.

FIG. 4 illustrates a cross-sectional view of an example of a semiconductor device package 400. Semiconductor device package 400 may be similar or identical to semiconductor device package 300 except that a bottom surface of the common frame structure 330_1, 330_2, 330_3 and/or a bottom surface of the first and second power semiconductor device pads 332_1, 332_2 are exposed entirely or at least partially within the outline of the mold compounds 114, 124 from the first mold compound 114 and the second mold compound 124, respectively. Thus, similar to the exposed second surface 130B of the lead frame 130 in FIG. 2, a direct thermal and electrical contact may be made to the bottom surfaces of the first and second power semiconductor device pads 332_1, 332_2 and, if desired, also to the bottom surfaces of the common frame structure 330_1, 330_2, 330_3. Further, while one of the package bodies 110, 120 may have a design as shown in FIG. 2, the other package body 120, 110 may be designed according to FIG. 4.

The common frame structure 330_1, 330_2, 330_3 may be made of the same material or may be made of a different material as the first and second power semiconductor device pads 332_1, 332_2. The first power semiconductor device pad 332_1 may be made of the same material or may be made of a different material as the second power semiconductor device pad 332_2. Further, the thickness of the common frame structure 330_1, 330_2, 330_3 may be identical or greater or smaller than the thickness of the first and second power semiconductor device pads 332_1, 332_2. It is to be noted that the thickness of all parts are measured in a direction from an upper surface (e.g. first surface 130A of the lead frame 130) to a bottom surface (e.g. second surface 130B of the lead frame 130) of a respective part.

A thickness of the lead frame 130 and/or the hybrid lead frame 330 (in particular the common frame structure 330_1, 330_2, 330_3 and/or the first and second power semiconductor device pads 332_1, 332_2) may, e.g., be equal to or greater than or less than 0.3 mm, 0.4 mm, 0.5 mm, 0.6 mm, 0.7 mm, 0.8 mm, 0.9 mm, 1.0 mm, 1.2 mm, 1.4 mm, 1.6 mm, 1.8 mm, 2.0 mm, 2.2 mm, 2.4, mm, 2.6 mm, 2.8 mm, or 3.0 mm. E.g. in a hybrid lead frame 330 or in a lead frame 130 having different thickness (e.g. a so-called dual gauge lead frame), the thickness of the first and second power semiconductor device pads 332_1, 332_2 may be greater than the thickness of one or more of the parts of the common frame structure 330_1, 330_2, 330_3 330_1, with the ratio of the thicknesses may, e.g., be equal to or greater than a factor of 1.2, 1.4, 1.6, 1.8, 2.0, 2.5, 3.0, or more. An area size of the first and second power semiconductor device pads 332_1, 332_2 may, e.g., be equal to or greater than or less than the values stated above for the footprint area of the power semiconductor chips.

Figure 5:
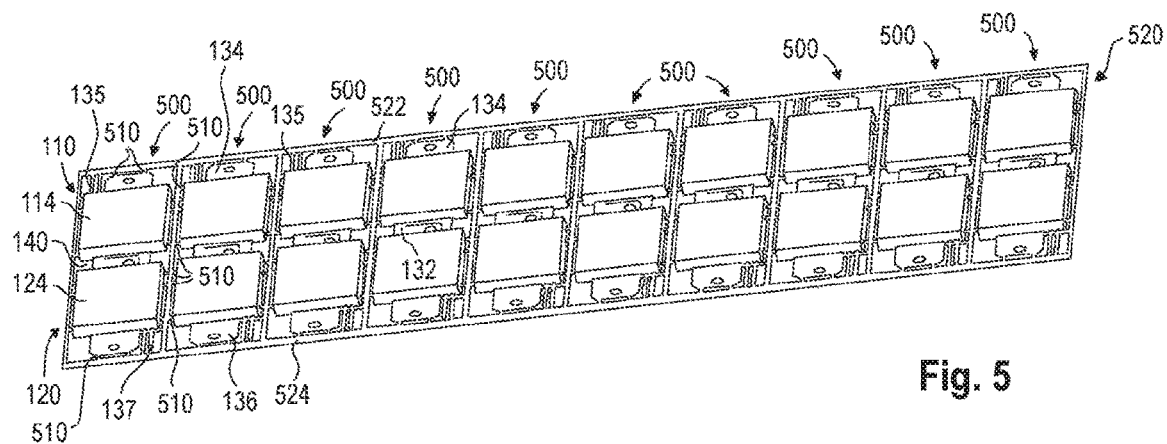
FIG. 5 is a perspective top side view of an array of semiconductor device packages 500 each including first and second package bodies in a stage of the manufacturing process before lead separation.

FIG. 5 is a perspective top side view of an array of semiconductor device packages 500 each including first and second package bodies 110 and 120, respectively. As shown in FIG. 5, the package bodies 110, 120 of each semiconductor device package 500 are separated by the spacing 140. The intermediate part 132 of the lead frame 130 is exposed from the first and second mold compounds 114, 124 within the spacing 140.

The lead frame 130 may further include a first end part 134 protruding out of the first mold compound 114 and a second end part 136 protruding out of the second mold compound 124. Further, leads 135 and/or 137 may protrude out of the first mold compound 114 and the second mold compound 124, respectively.

Adjacent semiconductor device packages 500 may be connected to each other via tie-bars 510. Tie-bars 510 may also connect the first end part 134 to a longitudinal frame bar 522 of a continuous lead frame 520 and tie-bars 510 may be used to connect the second end part 136 to another longitudinal frame bar 524 of the continuous lead frame 520. The individual semiconductor device packages 500 are separated out of the continuous lead frame 520 during the manufacturing process by cutting the tie-bars 510 between the first end parts 134 and the longitudinal frame bar 522, the tie-bars 510 between the second end parts 136 and the longitudinal frame bar 524 and the tie-bars 510 between adjacent semiconductor device packages 500. Further, the semiconductor device package 500 may have any one of the features as explained in conjunction with the semiconductor device packages 100-400 illustrated in FIGS. 1-4, and vice versa.

Figure 6:
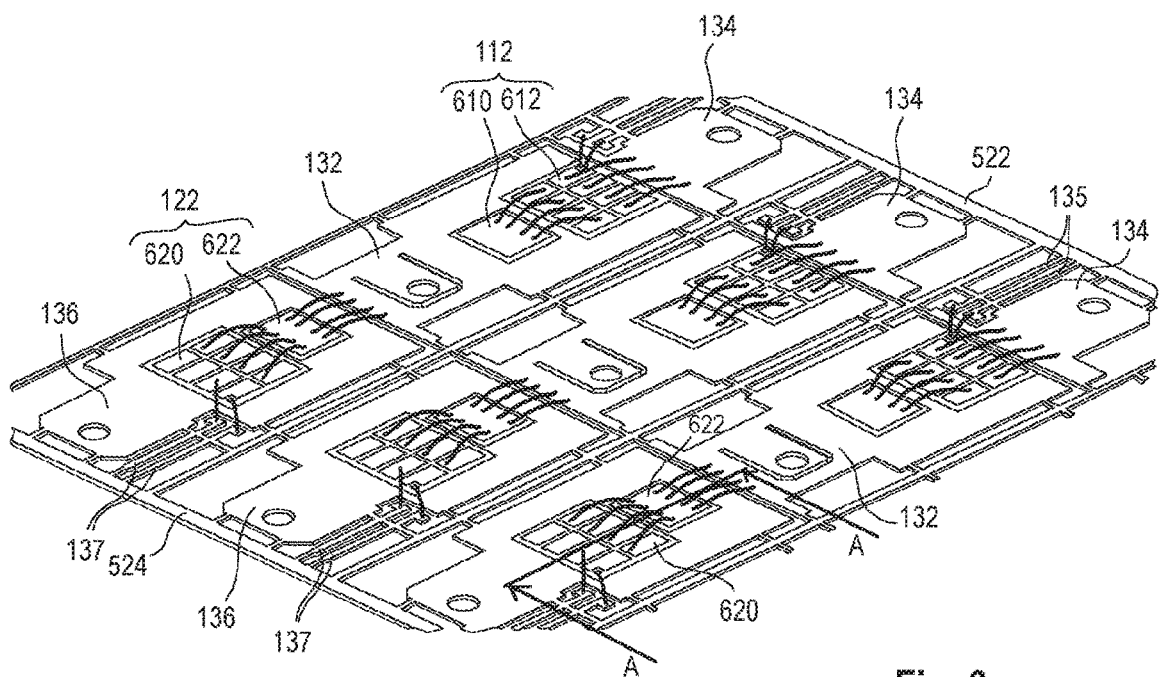
FIG. 6 is a perspective top side view of the array of semiconductor device packages 500 of FIG. 5 in a stage of the manufacturing process before encapsulating the first and second power semiconductor devices in first and second mold compounds, respectively.

FIG. 6 is a top view of the array of the semiconductor device packages 500 of FIG. 5 in a stage of the manufacturing process before encapsulating the first and second power semiconductor devices 112, 122 in first and second mold compounds 114 and 124, respectively. In this example, the lead frame 130 corresponds, e.g., to a lead frame 130 as shown in FIGS. 1A, 1B and 2.

In the example shown in FIG. 6, the first power semiconductor device 112 includes a number of semiconductor power chips 610, 612 and the second power semiconductor device 122 may include a number of power semiconductor chips 620, 622. The power semiconductor chips 610, 612 and the power semiconductor chips 620, 622 may, e.g., be mounted directly on the lead frame 130. Further, the first power semiconductor device 112 and/or the second power semiconductor device 122 may include driver and/or control functionality and one or more power semiconductor chips. For instance, semiconductor chips 610, 620 may include control electrode (e.g. gate) driver circuitry while semiconductor chips 612, 622 may be power semiconductor chips as described above. Further, stacked chip arrangements (not shown) are also feasible, e.g. power chip-on-power chip or driver chip-on-power chip, etc.

Figure 7:
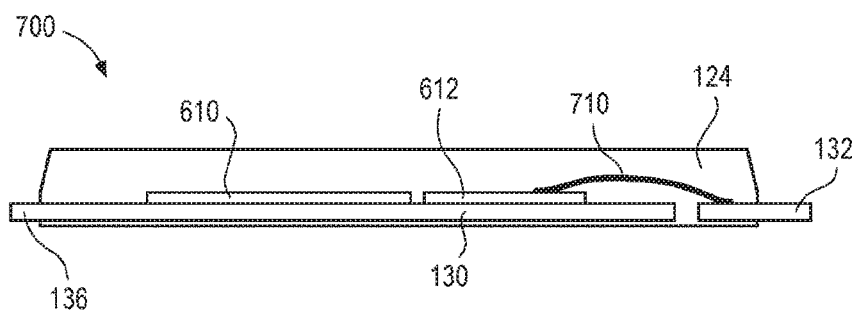
FIG. 7 is a cross-sectional view of an example of a semiconductor device package 700 along line A-A of FIG. 6 after encapsulation.

FIG. 7 illustrates a cross-sectional view of an example of the semiconductor device package 500 along line A-A of FIG. 6 after encapsulation. As apparent from FIG. 7, the intermediate part 132 of the lead frame 130 may be connected by an electrical connection element 710 such as, e.g., a bonding wire to the power semiconductor chip 612. Similar connections may be provided between the power semiconductor chips 612 and 610 and between the semiconductor chip 610 and the leads 137.

Figure 8A:
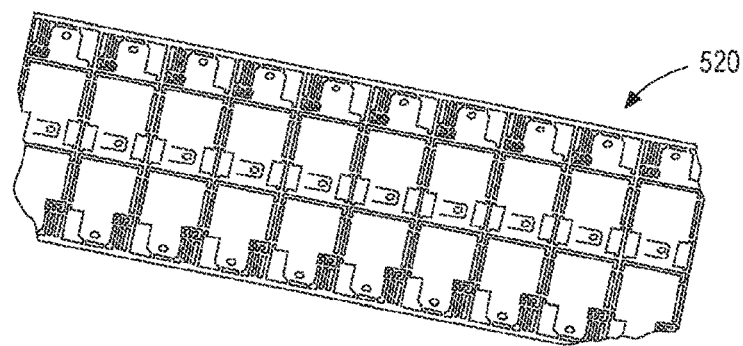
FIG. 8A is a perspective view of a lead frame in a stage of the manufacturing process before mounting the first and second power semiconductor devices onto the lead frame.

FIG. 8A is a perspective view of a continuous lead frame 520 used for the lead frame 130 in a stage of the manufacturing process before mounting the first and second power semiconductor devices 112, 122 onto the lead frame 130.

Figure 8B:
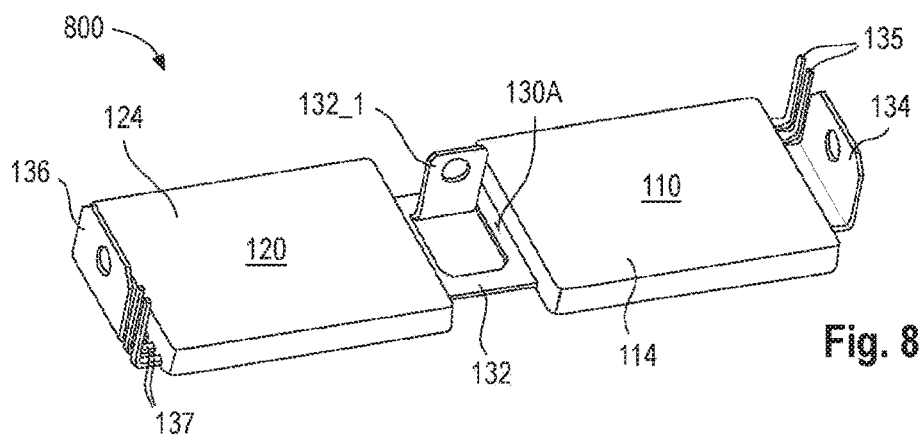
FIG. 8B is a perspective view of an example of a semiconductor device package 800 including first and second package bodies.

FIG. 8B is a perspective view of an example of a semiconductor device package 800 including a first package body 110 and a second package body 120. The semiconductor device package 800 has been separated out of the continuous lead frame 520. Further, as shown in FIG. 8B, the leads 135, 137 and the first and second end parts 134, 136 of the lead frame 130 may be bent by, e.g., an angle of about 90°. Further, the intermediate part 132 of the lead frame 130 may include a cut line defining a tongue-shaped tab, e.g. a bent-out flap 132_1. The bent-out flap 132_1 is bent out of the plane of the lead frame 130 to extend, e.g., in a plane perpendicular to the plane of the lead frame 130. The bent-out flap 132_1 of the intermediate part 132 of the lead frame 130 may be provided with a through hole. It is to be noted that the leads 135 and/or 137 may also protrude out of the first mold compound 114 and the second mold compound 124 at the opposing package body sides, i.e. adjacent to the intermediate part 132 of the lead frame 130. In this and other cases, it is possible that the leads 135 and 137 are unitary, i.e. form an integral part of the intermediate part 132 of the lead frame 130. Such design allows to combine the connectivity and/or functionality (e.g. control and/or sense functionality) associated with the leads 135 and 137 in the respective package bodies 110, 120.

Figure 8C:
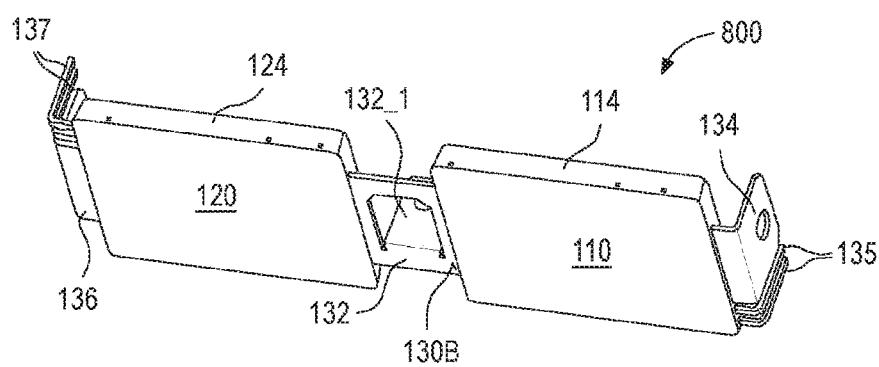
FIG. 8C is another perspective view of the semiconductor device package 800.

FIG. 8C is a perspective view of the semiconductor device package 800 illustrating the bottom of the package. As apparent, the semiconductor device package 800 may be constructed in accordance with the semiconductor device package 100, i.e. the lead frame 130 may be covered by the first mold compound 114 and the second mold compound 124 at both the first and the second surfaces 130A, 130B.

Figure 8D:
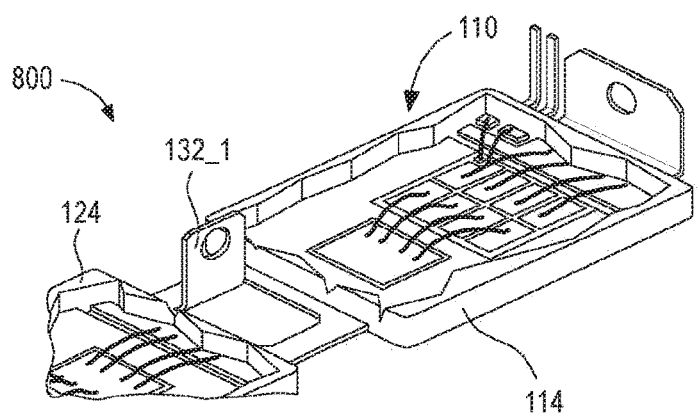
FIG. 8D is another perspective view of the partial semiconductor device package 800 showing the interior of the package bodies by cut open mold compounds.

FIG. 8D is a perspective view of the semiconductor device package 800 showing the interior of the package bodies by cut open first and second mold compounds 114, 124.

Figure 9A:
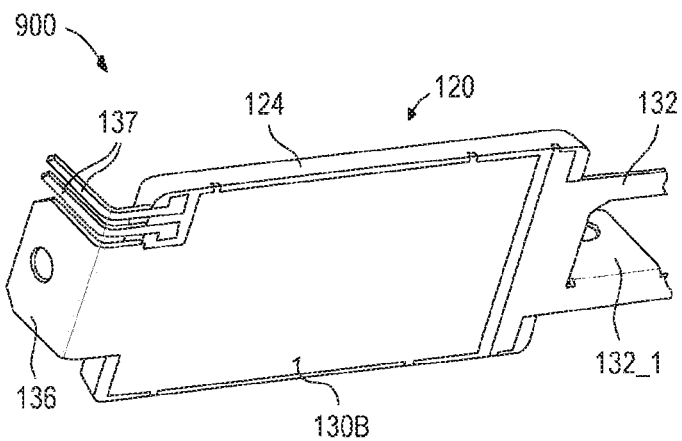
FIG. 9A is a partial (one package body) perspective view of an example of a semiconductor device package 900 including a lead frame exposed at the bottom of the semiconductor device package.

FIG. 9A is a partial perspective bottom side view of an example of a semiconductor device package 900. Only one package body 120 with mold compound 124 is depicted. As apparent from FIG. 9A, in this case the lead frame 130 is exposed at the bottom of the semiconductor device package 900. Thus, the semiconductor device package 900 may be designed in accordance with the semiconductor device package 200 of FIG. 2. Further, similar or identical features as in semiconductor device packages 700 and 800 are provided in semiconductor device package 900, and reference is made to the corresponding disclosure to avoid reiteration.

Figure 9B:
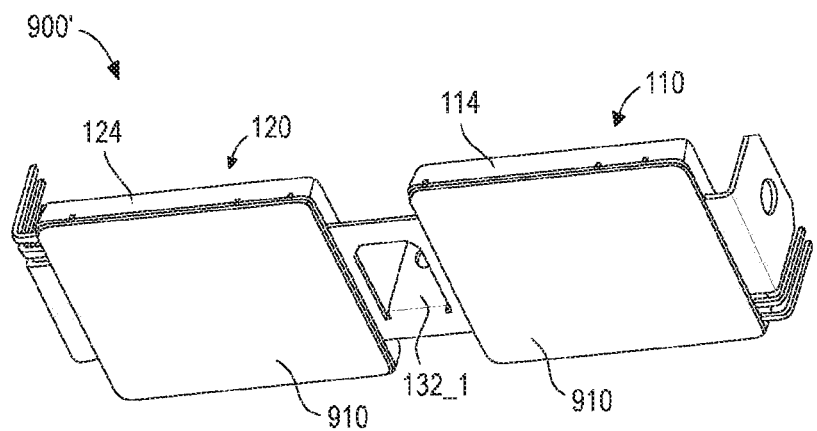
FIG. 9B is a perspective view of a semiconductor device package 900' which corresponds to semiconductor device package 900 with a thermal interface material (TIM) applied to the exposed face of the lead frame.

FIG. 9B illustrates a semiconductor device package 900' which is identical to semiconductor device package 900 except that a thermal interface material (TIM) 910 may be applied to the exposed second main surface 130B of the lead frame 130. The TIM 910 may, e.g., partially or completely cover the bottom of each package body 112, 122. The TIM 910 may provide for an electrical insulation of the second surface 130B of the lead frame 130 exposed from the first and second mold compounds 114, 124. Further, the TIM 910 may provide for a lower thermal resistance than the first and second mold compounds 114, 124 if the second surface 130B of the lead frame 130 would be covered by the encapsulation material as illustrated in FIG. 8C.

Figure 9C:
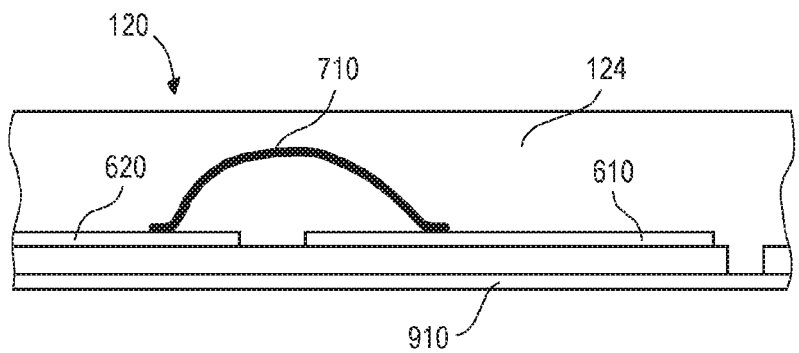
FIG. 9C is a cross-sectional view of an example of the semiconductor device package 900' of FIG. 9B.

FIG. 9C is a partial cross-sectional view of the semiconductor device package 900' of FIG. 9B. FIG. 9C illustrates an electrical connection element (e.g. a bonding wire) 710 interconnecting, e.g., the first power semiconductor chip 610 with the second power semiconductor chip 620.

Figure 10A:
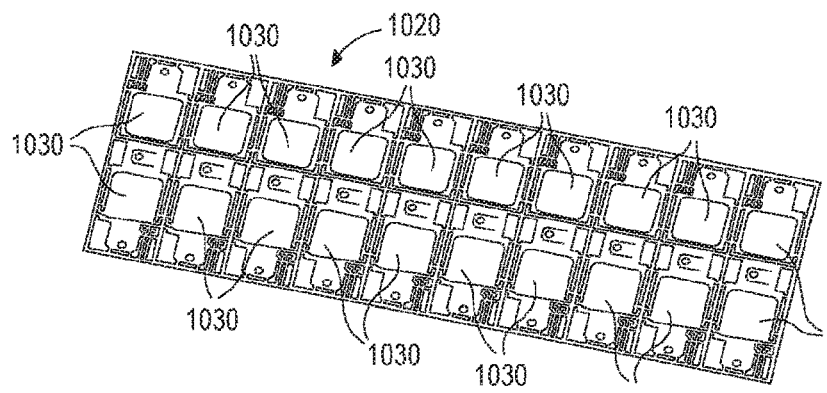
FIG. 10A is a perspective top side view of a lead frame 1020 having cutouts used as a hybrid lead frame in a stage of the manufacturing process before mounting the first and second power semiconductor devices onto the lead frame.

FIG. 10A is a top view of a continuous lead frame 1020 used as a hybrid lead frame. The continuous lead frame 1020 may be identical or similar to the continuous lead frame 520 of FIG. 8A except that the lead frame has cutouts 1030 corresponding to the openings (cutouts) 335_1, 335_2 of the hybrid lead frame 330 of FIGS. 3A, 3B and 4.

Figure 10B:
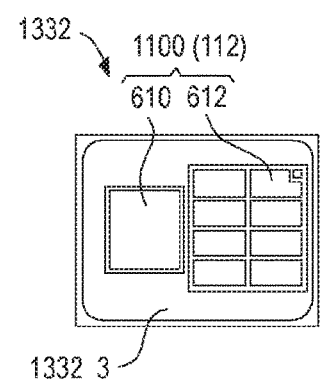
FIG. 10B is a top side view of an example of a power semiconductor device pad and a power semiconductor device mounted thereon configured to be inserted into the cutouts of the lead frame of FIG. 10A.

FIG. 10B is a top view of an example of a power semiconductor device pad 1332 and a power semiconductor device 1100 mounted thereon. By way of example, the power semiconductor device 1100 may be the first power semiconductor device 112 including, e.g., power semiconductor chips 610, 612, or may be the second power semiconductor device 122 including, e.g., power semiconductor chips 620, 622.

Figure 10C:
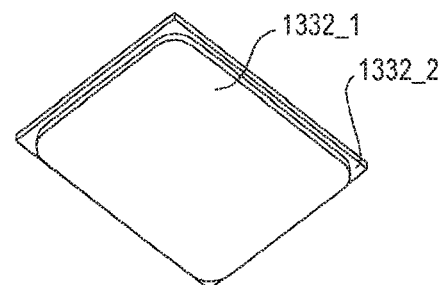
FIG. 10C is perspective bottom side view of the power semiconductor device pad of FIG. 10B.

FIG. 10C is a perspective bottom side view of the power semiconductor device pad 1332. The power semiconductor device pad 1332 may, e.g., be implemented by one of the examples of first and/or second power semiconductor device pads 332_1, 332_2 as mentioned in conjunction with FIGS. 3A, 3B and 4. In the example shown in FIG. 10C, the power semiconductor device pad 1332 may be a direct bonded copper (DBC) substrate, e.g. may comprise a bottom copper layer 1332_1, a top copper layer 1332_3 and a ceramic material layer 1332_2 sandwiched between the two copper layers 1332_1 and 1332_3.

Figure 10D:
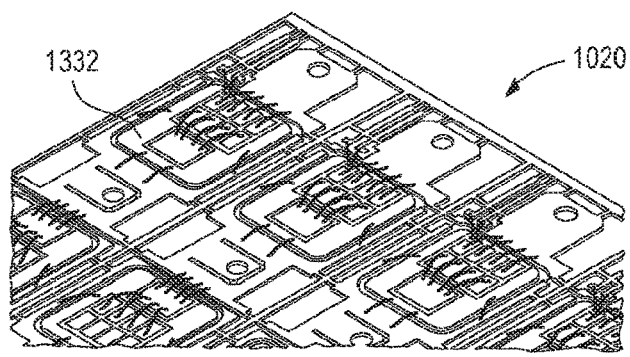
FIG. 10D is a partial perspective top side view of an array of semiconductor device packages 1000 in a stage of the manufacturing process before encapsulating the first and second power semiconductor devices in first and second mold compounds, respectively.

FIG. 10D is a partial perspective top side view of an array of semiconductor device packages 1000 in a stage of the manufacturing process before encapsulation. As shown in FIG. 10D, the power semiconductor device pads 1332 have been inserted in the cutouts 1030 of the continuous lead frame 1020. Further features of the hybrid continuous lead frame 1020 are similar to the continuous lead frame 520, and reference is made to disclosure above to avoid reiteration.

Figure 10E:
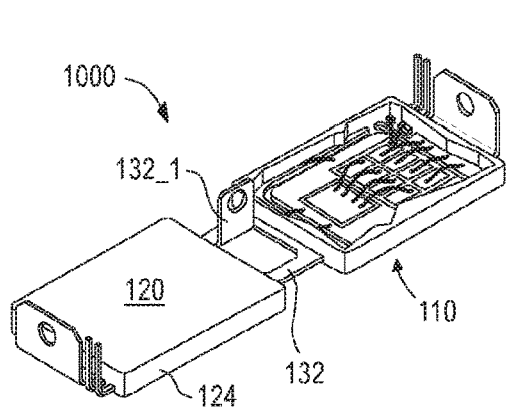
FIG. 10E is a perspective top side view of a semiconductor device package 1000 showing the interior of one package body by a cut open mold compound.
Figure 10F:
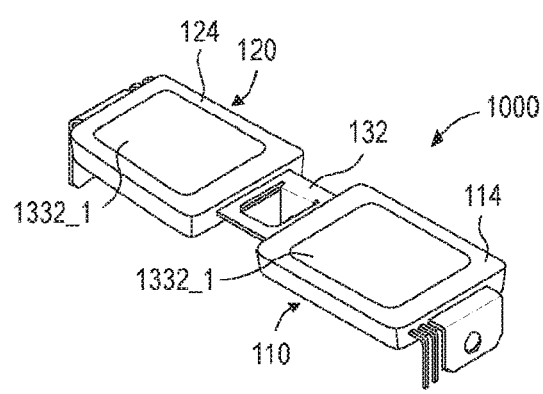
FIG. 10F is a perspective bottom side view of a semiconductor device package 1000 showing a lead frame which is exposed from the first and/or second mold compound.

FIGS. 10E and 10F illustrate top side and bottom side perspective views, respectively, of the semiconductor device package 1000. FIG. 10E illustrates the interior of the first package body, which is similar to the first package body 110 shown in FIG. 8D.

FIG. 10F illustrates that in semiconductor device package 1000 the bottom side (e.g. the bottom copper layer 1332_1) of the power semiconductor device pad 1332 may be exposed while the parts of the lead frame 130 which define the cutouts 1030 (FIGS. 3A, 3B and 4: openings 335_1, 335_2) may, e.g., be covered by encapsulation material. This concept of exposed power semiconductor device pads 1332 (e.g. exposed DBCs), which may also be applied to the hybrid lead frame 330 illustrated in FIGS. 3A, 3B and 4, allows for a high thermal dissipation capability while guaranteeing high mechanical robustness of the first and second package bodies 110, 120.

Figure 11A:
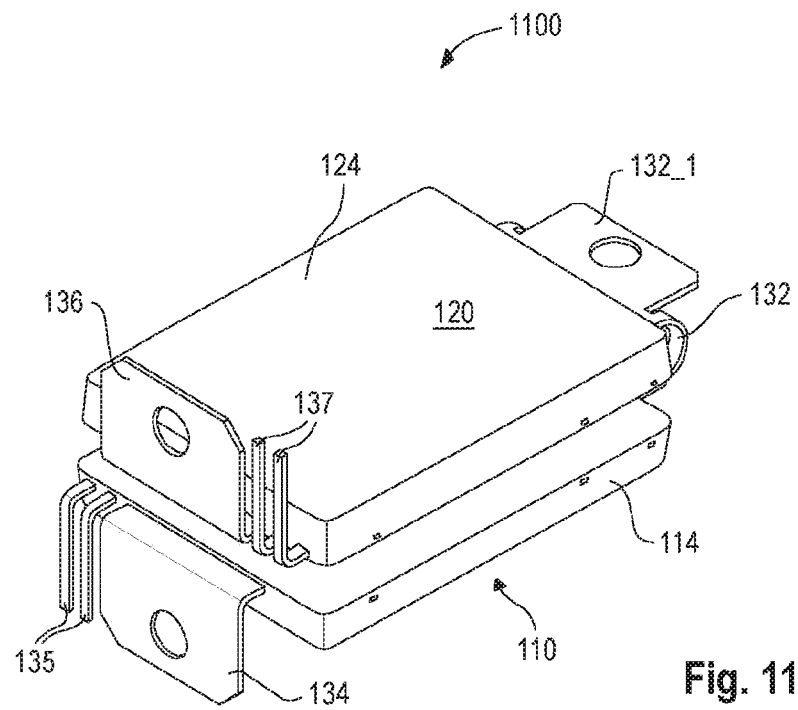
FIG. 11A is a perspective view of a semiconductor device package 1100 having the first package body and the second package body bent opposite to each other.
Figure 11B:
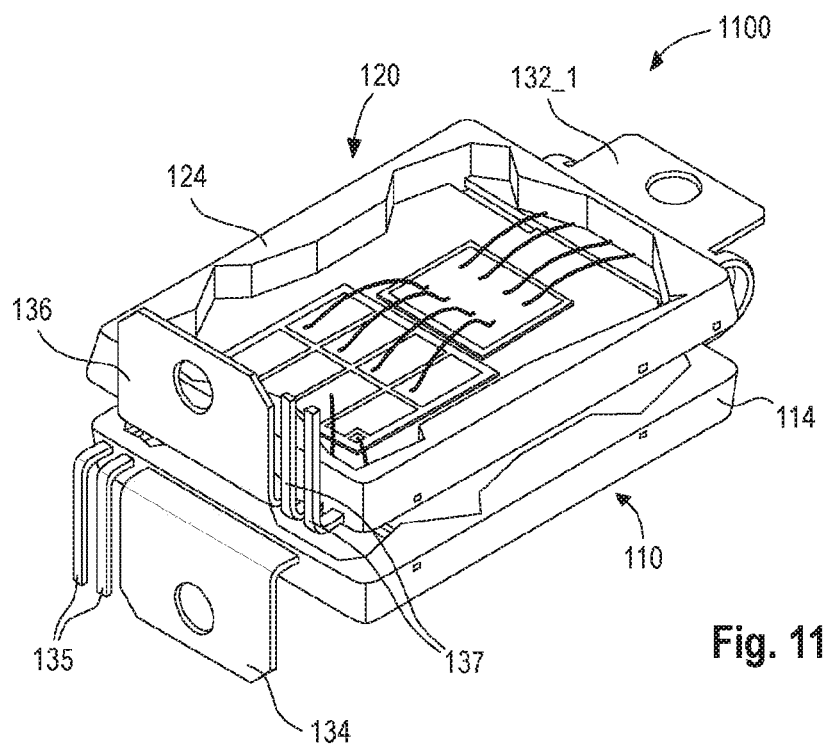
FIG. 11B is a perspective view of the semiconductor device package 1100 showing the interior of the package bodies by cut open mold compounds.

FIGS. 11A and 11B illustrate perspective views of a semiconductor device package 1100 having the first package body 110 and the second package body 120 bent to a predetermined angle towards each other, e.g. opposite to each other. In various embodiments, the first and second package bodies are "reverse bent", i.e. the bottom sides of the package bodies 110, 120 are bent towards each other. All package bodies 110, 120 of semiconductor device packages described herein may be brought into this positional relationship.

In all semiconductor device packages the first power semiconductor device 112 may comprise NS1 power switches and the second power semiconductor device 122 may comprise NS2 power switches. NS1 and NS2 are integers equal to or greater than 1. That is, each package body 110, 120 may, e.g., comprise a number of 1, 2, 3, . . . power switches.

Figure 12A:
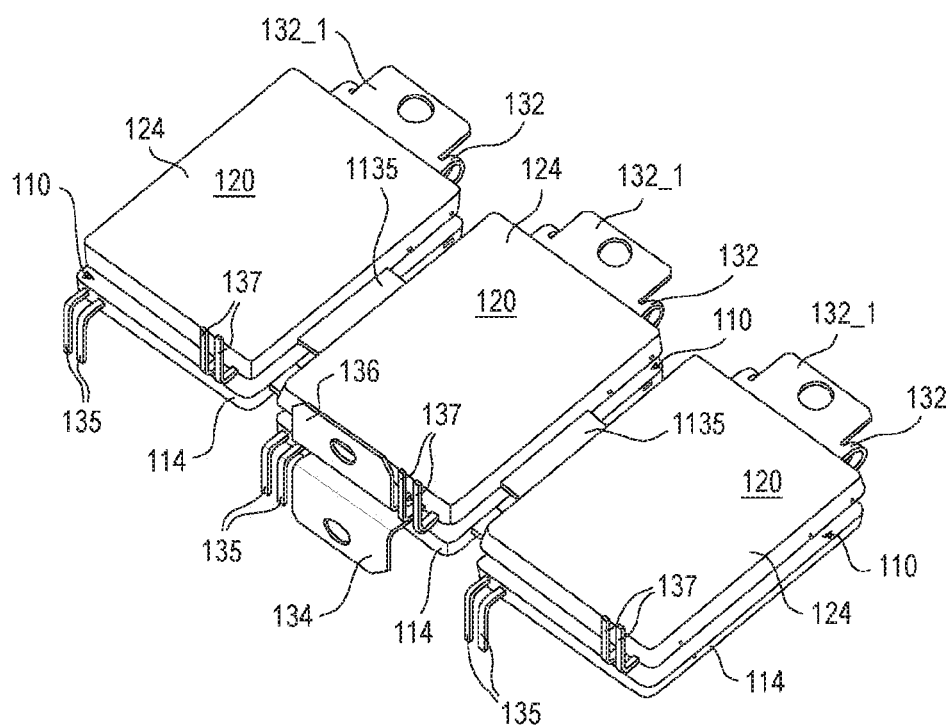
FIG. 12A is a perspective view of a semiconductor device package 1200 implementing a 3-phase bridge circuitry, wherein the number of package bodies is 6.
Figure 12B:
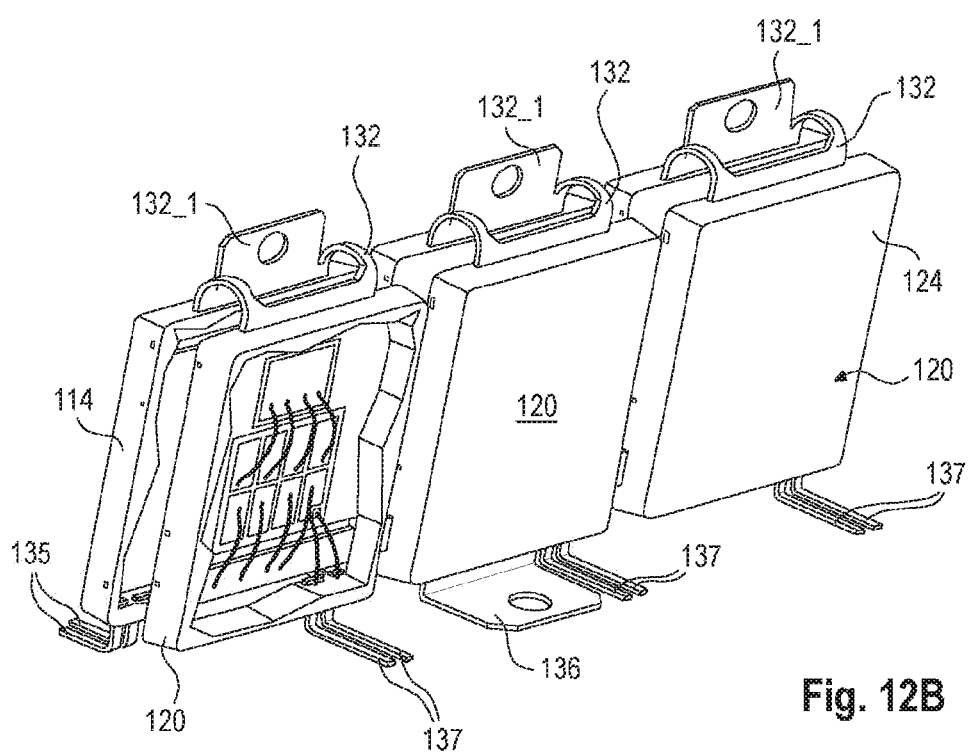
FIG. 12B is another perspective view of the semiconductor device package 1200 of FIG. 12A, with one package body cut open.

Moreover, as illustrated in FIGS. 12A and 12B by way of example, the semiconductor device packages disclosed herein may have a number of 1, 2, 3, ... first mold compounds (e.g. first package bodies 110) and may have a number of 1, 2, 3, ... mold compounds (e.g. second package bodies 120). FIGS. 12A and 12B illustrate a semiconductor device package 1200 which includes three first mold compounds (first package bodies 110) and three second mold compounds (second package bodies 120). In general, the semiconductor device package disclosed herein may include a number of NB mold compounds (or package bodies), wherein NB is an integer equal to or greater than 2.

The three first mold compounds 114 (package bodies 110) and the three second mold compounds 124 (package bodies 120) are each interconnected to each other by interconnecting parts 1135 of the lead frame 130. The interconnecting parts 1135 may be of the same material and of the same mechanical characteristics as the intermediate parts 132 of the lead frame 130. However, the interconnecting parts 1135 connect between the first mold compounds 114 (first package bodies 110), which are coplanar to each other, or connect between second mold compounds 124 (second package bodies 120), which are also coplanar to each other, but do not connect between first and second mold compounds (first and second package bodies 110, 120) which may be bent into planes which are, e.g., inclined or parallel but distant to each other.

In general, the multi-package body semiconductor device packages disclosed herein may implement a variety of different power devices. In various embodiments a semiconductor device package having two mold compounds 114, 124 (package bodies, e.g. a first package body 110 and a second package body 120) may comprise a half-bridge circuitry, wherein the first mold compound 114 (first package body 110) accommodates a low side (LS) switch of the half-bridge circuitry and the second mold compound 124 (second package body 120) accommodates a high side (HS) switch of the half-bridge circuitry, or vice versa.

If the semiconductor device package comprises four mold compounds 114, 124 (or package bodies), i.e. NB=4, the semiconductor device package may, e.g., comprise a 2-phase bridge circuitry, wherein each of the two first mold compounds 114 (first package bodies 110) accommodates a low side switch of the 2-phase bridge circuitry and each of the two second mold compounds 124 (second package bodies 120) accommodates a high side switch of the 2-phase bridge circuitry, or vice versa. Similarly, if the semiconductor device package includes six mold compounds 114, 124 (package bodies 110, 120), i.e. NB=6, as, e.g., illustrated in FIGS. 12A, 12B, the semiconductor device package may comprise a 3-phase bridge circuitry, wherein each of the three first mold compounds 114 (first package bodies 110) accommodates a low side switch of the 3-phase bridge circuitry and each of the three second mold compounds 124 (second package bodies 120) accommodates a high side switch of the 3-phase bridge circuitry, or vice versa.

Further, in all semiconductor device packages disclosed herein, the first and second end parts 134, 136 protruding out of the first and second mold compounds 114, 124, respectively, may form load external terminals of the semiconductor device package (i.e. terminals which are connected to a load electrode of a power transistor contained in the first or second power semiconductor device 112, 122) and the leads 135, 137 may form control and/or sense terminals of the semiconductor device package, i.e. external terminals which are connected to a gate electrode or a voltage and/or temperature sensing electrode of a power transistor contained in the first or second power semiconductor device 112, 124.

The first power semiconductor device 112 and the second power semiconductor device 122 of a semiconductor device package disclosed herein may have the same functionality or may have different functionalities.

Further, depending on the application of the semiconductor device packages described herein, voltages from, e.g., 2 V or equal to or greater than or less than, e.g., 12 V, 48 V, 100 V, 500 V, 1.0 kV, 1.2 kV, 1.5 kV, 2.0 kV, 2.5 kV or even up 6.5 kV may be operated (e.g. switched) by the semiconductor device packages described herein.

Figure 13:
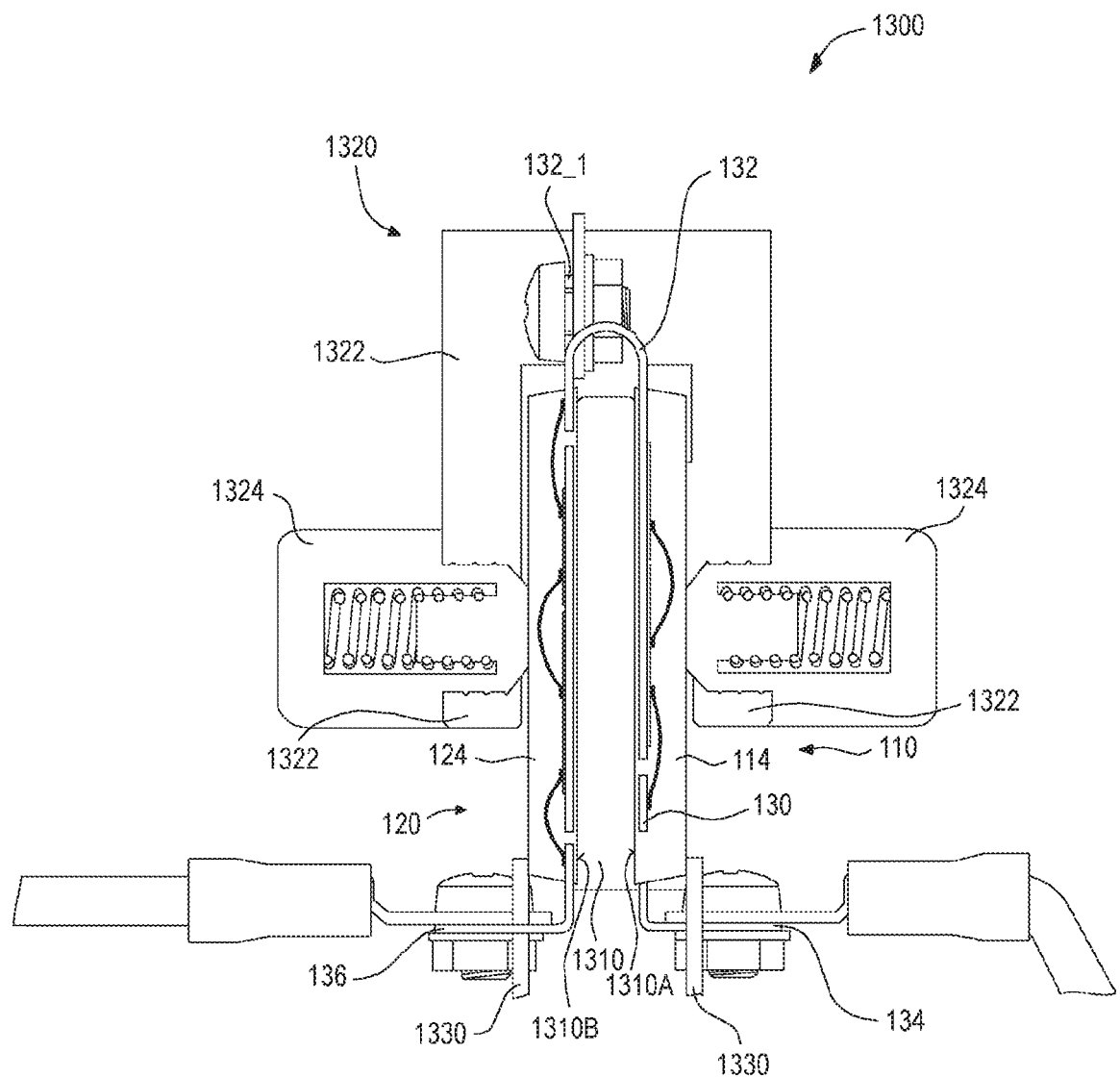
FIG. 13 is a cross-sectional view of an example of a power system 1300 having a common heat sink thermally and mechanically coupled to a first package body and a second package body of a semiconductor device package.

FIG. 13 is a cross-sectional view of an example of a power system 1300. The power system 1300 includes a semiconductor device package, e.g. in accordance with one or more of the multi-body semiconductor device packages described above. That is, the semiconductor device package includes a first package body 110 having a first power semiconductor device encapsulated in a first mold compound 114 and a second package body 120 including a second power semiconductor device encapsulated in a second mold compound 124. The semiconductor device package further includes the lead frame 130 configured to mechanically and electrically connect the first package body 110 and the second package body 120, wherein the first power semiconductor device and the second power semiconductor device are mounted on the lead frame 130. As explained above, the lead frame 130 may have an intermediate part 132 which is bent by an angle of, e.g., about 180°. The power system 1300 further comprises at least one heat sink, e.g. a common heat sink 1310 which is thermally and mechanically coupled to the first mold compound 114 (first package body 110) and the second mold compound 124 (second package body 120).

More specifically, the (e.g. common) heat sink 1310 may include a plate having a first surface 1310A and a second surface 1310B opposite the first surface 1310A. The first mold compound 114 (first package body 110) may be thermally and mechanically coupled to the first surface 1310A and the second mold compound 124 (second package body 120) may be thermally and mechanically coupled to the second surface 1310B of the plate. As described above, the thermal coupling may be provided by direct abutment of a bottom side material of the semiconductor device package (e.g. the lead frame, the encapsulation material or a TIM) to the first and second surfaces 1310A, 1310B of the common heat sink 1310. In particular, it is possible that no additional material (e.g. a thermal grease or any other thermally interfacing material) has to be used in between the semiconductor device package and the common heat sink 1310 during assembly of the power system 1300.

The semiconductor device package of the power system 1300 may be, e.g., a two body package, a three body package, a four body package, a five body package, a six body package, etc. By way of example, the semiconductor device package may comprise a half-bridge circuitry, a 2-phase bridge circuitry or a 3-phase bridge circuitry. As shown in FIG. 13, a screw clamp 1320 may be used to press the first and second package bodies 110, 120 onto the heat sink 1310. The screw clamp 1320 may, e.g., include a clamp bracket 1322 encompassing the first and second mold compounds 114, 124 (package bodies 110, 120) and a plurality of fixing screws 1324 for pressing the clamp bracket 1322 together.

As shown in FIG. 13, the first and second end parts 134, 136 of the lead frame 130 may serve as external terminals of the semiconductor device package. Further, gate driver PCBs 1330 are shown to provide gate control signals and/or voltage or temperature sensing signals.

Figure 14A:
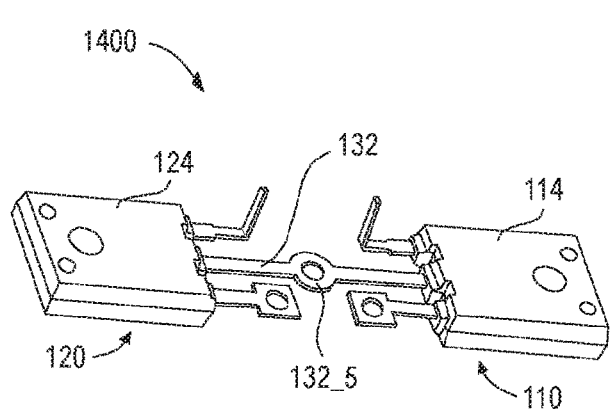
FIG. 14A is a perspective view of a semiconductor device package 1400 having two package bodies.
Figure 14B:
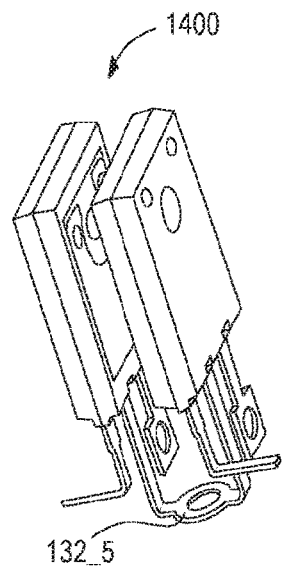
FIG. 14B is a perspective view of the semiconductor device package 1400 of FIG. 14A having the first package body and the second package body bent opposite to each other

FIGS. 14A and 14B are perspective views of a semiconductor device package 1400 having a first mold compound 114 (first package body 110) and a second mold compound 124 (second package body 120). The semiconductor device package 1400 has similar features as described above, and reference is made to the above disclosure in order to avoid reiteration. In particular, it is apparent from FIGS. 14A and 14B that the first and second package bodies 110, 120 may be standard package bodies such as, e.g., T0247 packages which, apart from the lead frame 130 and the unitary intermediate part 132 thereof, are conventional art.

The intermediate part 132 (e.g. power lead) of the lead frame 130 may have a ring-shaped central region 132_5. The ring-shaped central region 132_5 may define a through hole in the intermediate part 132 of the lead frame. The ring-shaped central region 132_5 of the intermediate part 132 of the lead frame 130 may serve as a (common) external terminal of the semiconductor device package 1400. The semiconductor device package 1400 may implement, e.g., a half-bridge circuitry.

Figure 15A:
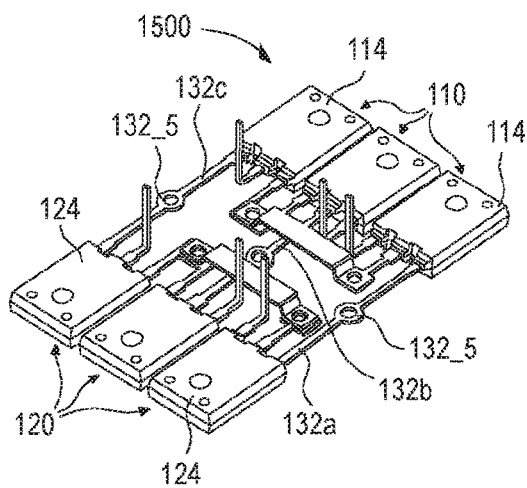
FIG. 15A is a perspective view of a semiconductor device package 1500 having 6 package bodies.
Figure 15B:
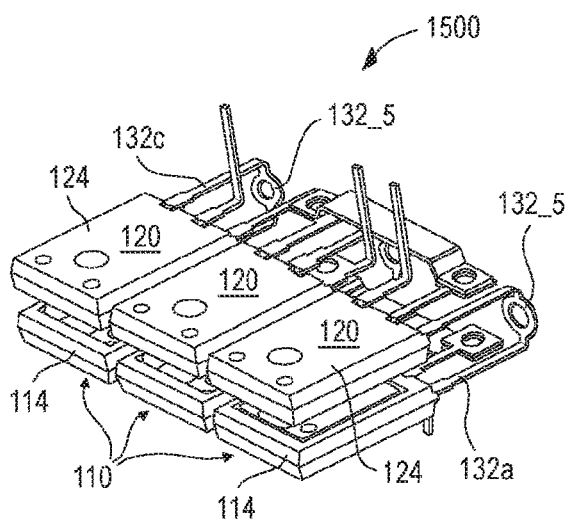
FIG. 15B is a perspective view of the semiconductor device package 1500 of FIG. 15B having the first and second package bodies bent opposite to each other

FIGS. 15A and 15B illustrate perspective views of a semiconductor device package 1500 having, e.g., six mold compounds (package bodies), wherein three of the six mold compounds (package bodies) are first mold compounds 114 (first package bodies 110) and the residual three are second mold compounds 124 (second package bodies 120). Again, each package body 110, 120 may, e.g., be a standard package body such as, e.g., a TO247 package.

The intermediate part 132 of the lead frame 130 may comprise at least three separate connections 132a, 132b and 132c. Each of these connections is unitary (integral) and connects a mold compound 114 (first package body 110) to a second mold compound 124 (second package body 120).

Figure 16:
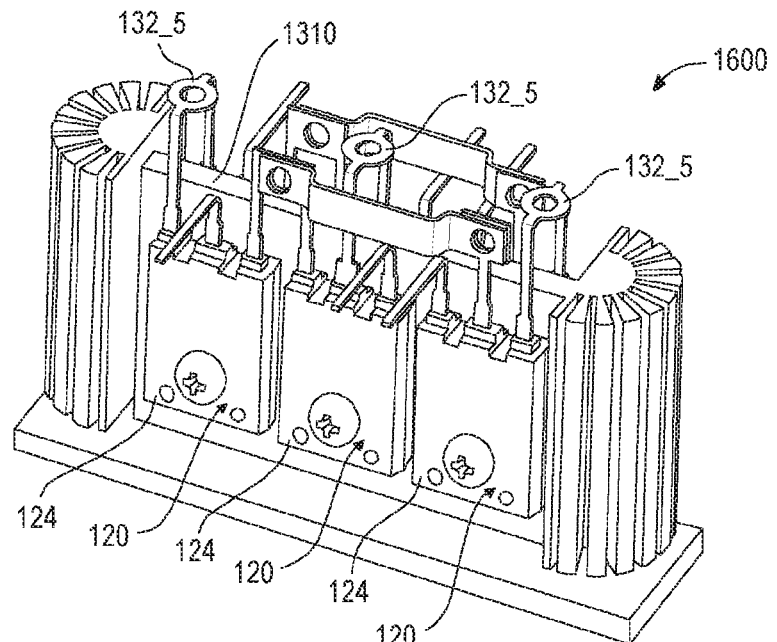
FIG. 16 is a perspective view of an example of a power system 1600 having a common heat sink thermally and mechanically coupled to the semiconductor device package of FIG. 15B.

FIG. 16 illustrates a perspective view of an example of a power system 1600. The power system 1600 may be similar to the power system 1300 except that a semiconductor device package 1500 is used. Therefore, reference is made to the above description in order to avoid reiteration. Similar as in power system 1300, a (common) heat sink 1310 having a plate is used for heat dissipation and the package bodies 110, 120 are reverse bent and in abutment with the plate. It is to be noted that in the power system 1600, each individual mold compound 114, 124 (package body 110, 120) is provided with a through-hole allowing the mold compound 114, 124 (package body 110, 120) to be fixed (e.g. screwed) onto the plate. Further, throughout the disclosure, instead of a common heat sink 1310 a plurality of heat sinks (e.g. one for each mold compound 114, 124 (package body 110, 120) or one for each pair of mold compounds 114, 124 (package bodies 110, 120) may be provided.

Figure 17:
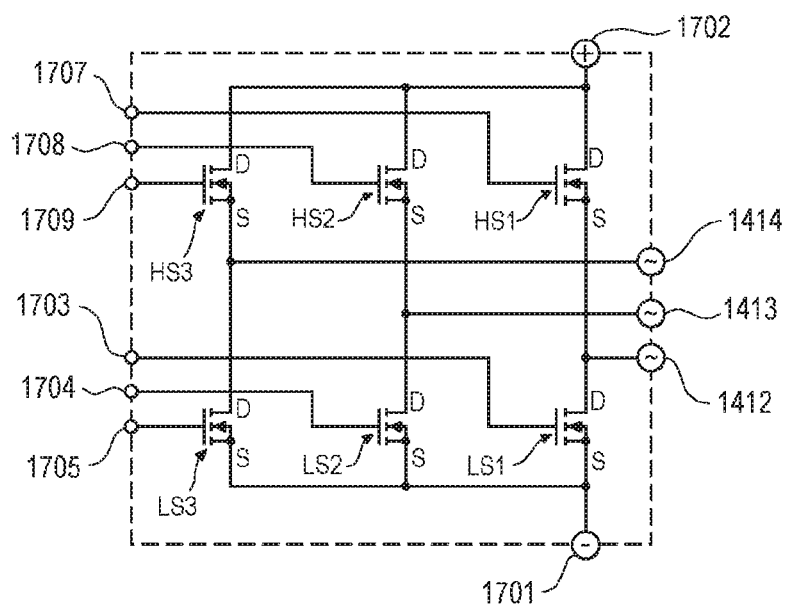
FIG. 17 is a circuit diagram of a 3-phase bridge 1700 as, e.g., implemented in semiconductor device packages of FIGS. 12A-12B and 15A-15B.

FIG. 17 is a circuit diagram of a 3-phase bridge circuitry 1700. Such 3-phase bridge circuitry 1700 may, e.g., be implemented in the semiconductor device packages shown in FIGS. 12A-12C and 15A-15B.

The 3-phase bridge circuitry includes three half-bridges. The first half-bridge comprises low side switch LS1 and high side switch HS1 connected in series between a negative supply voltage (e.g. ground: GND) 1701 and a positive supply voltage (e.g. battery: BAT) 1702. The second half-bridge comprises low side switch LS2 and high side switch HS2 connected in series between the negative supply voltage 1701 and the positive supply voltage 1702. The third half-bridge comprises low side switch LS3 and high side switch HS3 connected in series between the negative supply voltage 1701 and the positive supply voltage 1702. The control electrodes (e.g. gate electrodes) of the low side switches LS1, LS2 and LS3 are connected to nodes 1703, 1704 and 1705, respectively. The control electrodes (e.g. gate electrodes) of the high side switches HS1, HS2 and HS3 are connected to nodes 1707, 1708 and 1709, respectively.

The connection between low side switch LS1 and high side switch HS1 of the first, second and third half-bridges is connected to node 1412, node 1413 and node 1414, respectively.

In the example illustrated in FIG. 17, the low side switches LS1, LS2, LS3 and the high side switches HS1, HS2, HS3 are implemented, e.g., by MOSFETs. In FIG. 17, D denotes drain and S denotes source. However, other types of switches and other polarities are also possible. By way of example, it is also possible that the low side switches LS1, LS2, LS3 and the high side switches HS1, HS2, HS3 are implemented, e.g., by IGBTs. In this case, the circuit diagram would be similar to the circuit diagram of FIG. 17 except that IGBTs replace the MOSFETs. Then, an emitter would replace the source S and a collector would replace the drain D. Further, a 2-phase bride circuitry merely contains the first and second half-bridges LS1, HS1, LS2, HS2, and a half-bride circuitry merely contains the first half-bridge LS1, HS1.

As may be understood by comparing the circuit diagram of FIG. 17 with the semiconductor device packages disclosed herein, it appears that the first mold compound(s) 114 (first package body (bodies) 110) correspond, e.g., to the LS switch(es) and the second mold compound(s) 124 (second package body (bodies) 120) correspond, e.g., to the HS switch(es).

Figure 18:
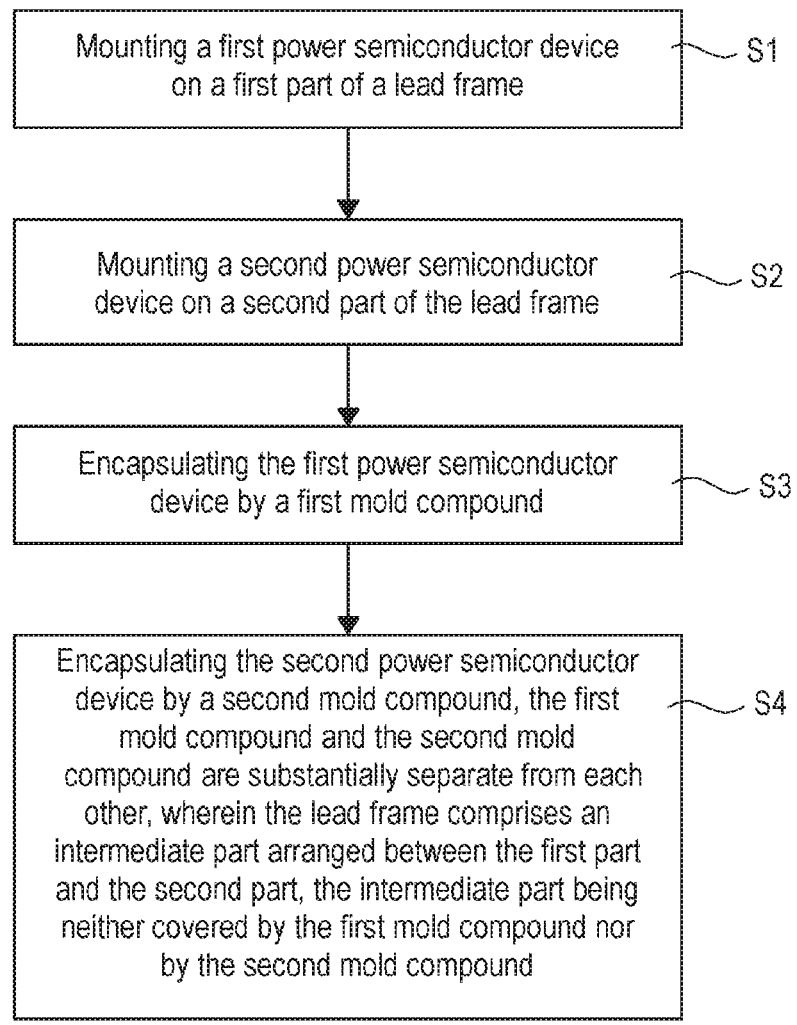
FIG. 18 is a flow diagram illustrating stages of an exemplary method of manufacturing a semiconductor device package in accordance with the disclosure.

FIG. 18 is a flow diagram illustrating stages of an exemplary method of manufacturing a semiconductor device package in accordance with the disclosure.

At S1, a first power semiconductor device is mounted on a first part of a lead frame.

At S2, a second power semiconductor device is mounted on a second part of a lead frame. In S1 and S2, any mounting technology such as, e.g., soldering, adhesive gluing, sintering, etc. may be used.

At S3, the first power semiconductor device is encapsulated by a first mold compound.

At S4, the second power semiconductor device is encapsulated by a second mold compound, the first mold compound and the second mold compound are substantially separate from each other, wherein the lead frame comprises an intermediate part arranged between the first part and the second part, the intermediate part is not covered by the first mold compound or by the second mold compound.

The method may further comprise separating leads of the lead frame to singularize the semiconductor device package out of the lead frame.

Throughout this disclosure, the first mold compound may be of the same encapsulating material or may be of a different encapsulating material than the second mold compound. Further, throughout this disclosure, the first mold compound and the second mold compound may be formed (e.g. molded, laminated, etc.) in one fabrication process or in separate fabrication processes (e.g. in one or more molding and/or laminating processes).

The method may further comprise bending the intermediate part of the lead frame to fold the first mold compound (first package body) back on the second mold compound (second package body).

The following examples pertain to further aspects of the disclosure:

Example 1 is a semiconductor device package, comprising a lead frame; a first power semiconductor device mounted on a first part of the lead frame; a second power semiconductor device mounted on a second part of the lead frame; the first power semiconductor device is encapsulated by a first mold compound; the second power semiconductor device is encapsulated by a second mold compound; wherein the first mold compound and the second mold compound are substantially separate from each other, and the lead frame comprises an intermediate part arranged between the first part and the second part, the intermediate part is not covered by the first mold compound or by the second mold compound.

In Example 2, the subject matter of Example 1 can optionally include wherein the first part of the lead frame is cast in the first mold compound and the second part of the lead frame is cast in the second mold compound.

In Example 3, the subject matter of Example 1 or 2 can optionally include wherein the lead frame is a unitary member.

In Example 4, the subject matter of any one of Examples 1 to 3 can optionally include wherein the intermediate part of the lead frame has an inherent structural stability sufficient to hold the first mold compound relative to the second mold compound in place.

In Example 5, the subject matter of any one of Examples 1 to 4 can optionally include wherein the intermediate part of the lead frame is plastically deformable by bending so as to allow the first mold compound and the second mold compound to be brought into mutually opposing positions.

In Example 6, the subject matter of any one of Examples 1 to 5 can optionally include wherein the intermediate part of the lead frame comprises a cut line defining a tongue-shaped tab.

In Example 7, the subject matter of any one of Examples 1 to 6 can optionally include wherein the intermediate part of the lead frame is provided with a through hole.

In Example 8, the subject matter of any one of Examples 1 to 7 can optionally include wherein the first part of the lead frame comprises a cutout, and a device pad inserted into the cutout, wherein the first power semiconductor device is mounted on the device pad.

In Example 9, the subject matter of any one of Examples 1 to 8 can optionally include wherein the first power semiconductor device is mounted on a first surface of the first part of the lead frame, and a second surface of the first part of the lead frame opposite the first surface is exposed from the first mold compound.

In Example 10, the subject matter of any one of Examples 1 to 9 can optionally include wherein the lead frame further comprises at least one of a first end part protruding out of the first mold compound and a second end part protruding out of the second mold compound.

In Example 11, the subject matter of any one of Examples 1 to 10 can optionally include a half-bridge circuitry, wherein the first mold compound accommodates a low side switch of the half-bride circuitry and the second mold compound accommodates a high side switch of the half-bride circuitry.

In Example 12, the subject matter of any one of Examples 1 to 11 can optionally include a number of NB first and second mold compounds, wherein NB is an integer equal to or greater than 3.

In Example 13, the subject matter of Example 12 can optionally include at least one of a 2-phase bridge circuitry, wherein NB is equal to or greater than 4, and a 3-phase bridge circuitry, wherein NB is equal to or greater than 6.

Example 14 is a power system, comprising a semiconductor device package, comprising a lead frame; a first power semiconductor device mounted on a first part of the lead frame; a second power semiconductor device mounted on a second part of the lead frame; the first power semiconductor device is encapsulated by a first mold compound; the second power semiconductor device is encapsulated by a second mold compound; wherein the first mold compound and the second mold compound are substantially separate from each other, and the lead frame comprises an intermediate part arranged between the first part and the second part, the intermediate part is not covered by the first mold compound or by the second mold compound; and a heat sink thermally and mechanically coupled to the first mold compound and the second mold compound.

In Example 15, the subject matter of Example 14 can optionally include wherein the heat sink comprises a plate having a first surface and a second surface opposite the first surface, the first mold compound is thermally and mechanically coupled to the first surface, and the second mold compound is thermally and mechanically coupled to the second surface.

In Example 16, the subject matter of Example 14 or 15 can optionally include at least one of a half-bridge circuitry, a 2-phase bridge circuitry and a 3-phase bridge circuitry.

Example 17 is a method of manufacturing a semiconductor device package, comprising mounting a first power semiconductor device on a first part of a lead frame; mounting a second power semiconductor device on a second part of the lead frame; encapsulating the first power semiconductor device by a first mold compound; encapsulating the second power semiconductor device by a second mold compound, the first mold compound and the second mold compound are substantially separate from each other, and wherein the lead frame comprises an intermediate part arranged between the first part and the second part, the intermediate part is not covered by the first mold compound or by the second mold compound.

In Example 18, the subject matter of Example 17 can optionally include wherein encapsulating the first power semiconductor device comprises casting the first part of the lead frame in the first mold compound; and encapsulating the second power semiconductor device comprises casting the second part of the lead frame in the second mold compound.

In Example 19, the subject matter of Example 17 or 18 can optionally include cutting leads of the lead frame to singularize the semiconductor device package out of the lead frame after the encapsulating.

In Example 20, the subject matter of any one of Examples 17 to 19 can optionally include bending the intermediate part of the lead frame to fold the first mold compound back on the second mold compound.

Although specific embodiments have been illustrated and described herein, it will be appreciated by those of ordinary skill in the art that a variety of alternate and/or equivalent implementations may be substituted for the specific embodiments shown and described without departing from the scope of disclosure. This application is intended to cover any adaptations or variations of the specific embodiments discussed herein.

What is claimed is:
1. A semiconductor device package, comprising:
a metal lead frame;
a first power semiconductor device mounted directly to a first metal part of the metal lead frame; and a second power semiconductor device mounted directly to a second metal part of the metal lead frame,
wherein the first power semiconductor device is encapsulated by a first mold compound,
wherein the second power semiconductor device is encapsulated by a second mold compound,
wherein the first mold compound and the second mold compound are substantially separate from each other,
wherein the metal lead frame comprises an intermediate metal part arranged between the first metal part and the second metal part,
wherein the intermediate metal part is not covered by the first mold compound or the second mold compound.

2. The semiconductor device package of claim 1, wherein the first metal part of the metal lead frame is cast in the first mold compound and the second metal part of the metal lead frame is cast in the second mold compound.

3. The semiconductor device package of claim 1, wherein the metal lead frame is a unitary member, and wherein the first metal part, the second metal part and the intermediate metal part are each an integral part of the unitary member.

4. The semiconductor device package of claim 1, wherein the intermediate metal part of the metal lead frame has an inherent structural stability sufficient to hold the first mold compound relative to the second mold compound in place.

5. The semiconductor device package of claim 1, wherein the intermediate metal part of the metal lead frame is bent so that the first mold compound and the second mold compound are in mutually opposing positions.

6. The semiconductor device package of claim 1, wherein the intermediate metal part of the metal lead frame comprises a cut line defining a tongue-shaped tab.

7. The semiconductor device package of claim 1, wherein the intermediate metal part of the metal lead frame is provided with a through hole.

8. The semiconductor device package of claim 1, wherein the first metal part of the metal lead frame comprises:
a cutout; and
a device pad inserted into the cutout,
wherein the first power semiconductor device is mounted directly to the device pad.

9. The semiconductor device package of claim 1, wherein the first power semiconductor device is mounted directly to a first surface of the first metal part of the metal lead frame, and wherein a second surface of the first metal part of the metal lead frame opposite the first surface is exposed from the first mold compound.

10. The semiconductor device package of claim 1, wherein the metal lead frame further comprises at least one of a first end part protruding out of the first mold compound and a second end part protruding out of the second mold compound.

11. The semiconductor device package of claim 1, further comprising a half-bridge circuitry, wherein the first mold compound accommodates a low side switch of the half-bridge circuitry and the second mold compound accommodates a high side switch of the half-bridge circuitry.

12. A power system, comprising:
a semiconductor device package, comprising:
a metal lead frame;
a first power semiconductor device mounted directly to a first metal part of the metal lead frame; and
a second power semiconductor device mounted directly to a second metal part of the metal lead frame,
wherein the first power semiconductor device is encapsulated by a first mold compound,
wherein the second power semiconductor device is encapsulated by a second mold compound,
wherein the first mold compound and the second mold compound are substantially separate from each other,
wherein the metal lead frame comprises an intermediate metal part arranged between the first metal part and the second metal part,
wherein the intermediate metal part is not covered by the first mold compound or by the second mold compound; and
a heat sink in contact with the first mold compound and the second mold compound.

13. The power system of claim 12, wherein the heat sink comprises a plate having a first surface and a second surface opposite the first surface, wherein the first mold compound is in contact with the first surface, and wherein the second mold compound is in contact with the second surface.

14. The power system of claim 12, further comprising:
at least one of a half-bridge circuitry, a 2-phase bridge circuitry and a 3-phase bridge circuitry.

* * * * *